United States Patent
Eilert et al.

(10) Patent No.: US 11,397,694 B2
(45) Date of Patent: Jul. 26, 2022

(54) MEMORY CHIP CONNECTING A SYSTEM ON A CHIP AND AN ACCELERATOR CHIP

(71) Applicant: Micron Technology, Inc., Boise, ID (US)

(72) Inventors: Sean S. Eilert, Penryn, CA (US); Kenneth Marion Curewitz, Cameron Park, CA (US); Justin M. Eno, El Dorado Hills, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/573,805

(22) Filed: Sep. 17, 2019

(65) Prior Publication Data

US 2021/0081337 A1    Mar. 18, 2021

(51) Int. Cl.
| | |
|---|---|
| *G06F 3/00* | (2006.01) |
| *G06F 13/16* | (2006.01) |
| *G06F 9/30* | (2018.01) |
| *G11C 7/10* | (2006.01) |

(52) U.S. Cl.
CPC ...... *G06F 13/1668* (2013.01); *G06F 9/30036* (2013.01); *G11C 7/10* (2013.01)

(58) Field of Classification Search
CPC ... G06F 13/00; G06F 13/1668; G06F 9/30036
USPC .................. 710/113, 305–306, 100; 711/118
See application file for complete search history.

(56) References Cited

U.S. PATENT DOCUMENTS

| | | | |
|---|---|---|---|
| 6,928,512 B2 | 8/2005 | Ayukawa et al. | |
| 7,627,744 B2 | 12/2009 | Maher et al. | |
| 9,195,602 B2 | 11/2015 | Hampel et al. | |
| 9,760,497 B2 | 9/2017 | Nakajima et al. | |
| 10,114,558 B2 | 10/2018 | Miller et al. | |
| 11,074,042 B2 | 7/2021 | Howard et al. | |
| 11,163,490 B2 | 11/2021 | Curewitz et al. | |

(Continued)

FOREIGN PATENT DOCUMENTS

WO    2015101827    7/2015

OTHER PUBLICATIONS

International Search Report and Written Opinion, PCT/US2020/049942, dated Dec. 17, 2020.

(Continued)

*Primary Examiner* — Henry Tsai
*Assistant Examiner* — Kim T Huynh
(74) *Attorney, Agent, or Firm* — Greenberg Traurig

(57) ABSTRACT

A memory chip (e.g., DRAM) connecting a SoC and an accelerator chip (e.g., an AI accelerator chip). A system including the memory chip and the accelerator chip. The system can include the SoC. The memory chip can include first memory cells to store and provide computation input data (e.g., AI computation input data) received from the SoC to be used by the accelerator chip as computation input (e.g., AI computation input). The memory chip can include second memory cells to store and provide first computation output data (e.g., AI computation output data) received from the accelerator chip to be retrieved by the SoC or reused by the accelerator chip as computation input. The memory chip can also include third memory cells to store second computation output data (e.g., non-AI computation output data) related to non-AI tasks received from the SoC to be retrieved by the SoC for non-AI tasks.

16 Claims, 11 Drawing Sheets

(56) References Cited

U.S. PATENT DOCUMENTS

| | | | |
|---|---|---|---|
| 2003/0023958 A1* | 1/2003 | Patel | G06F 9/45504 717/146 |
| 2003/0212845 A1 | 11/2003 | Court et al. | |
| 2005/0075154 A1 | 4/2005 | Bordes et al. | |
| 2005/0075849 A1 | 4/2005 | Maher et al. | |
| 2005/0086040 A1 | 4/2005 | Davis et al. | |
| 2005/0135353 A1 | 6/2005 | Chandra et al. | |
| 2005/0135367 A1 | 6/2005 | Chandra et al. | |
| 2005/0189426 A1 | 9/2005 | Nishizawa et al. | |
| 2005/0273570 A1 | 12/2005 | Desouter et al. | |
| 2006/0156074 A1 | 7/2006 | Kumar | |
| 2009/0022077 A1 | 1/2009 | Lin et al. | |
| 2009/0063786 A1 | 3/2009 | Oh | |
| 2009/0113078 A1 | 4/2009 | Schnell et al. | |
| 2010/0030951 A1 | 2/2010 | Kim | |
| 2010/0217977 A1 | 8/2010 | Goodwill et al. | |
| 2011/0087834 A1 | 4/2011 | Tremaine | |
| 2011/0161555 A1 | 6/2011 | Olds et al. | |
| 2012/0054422 A1 | 3/2012 | Gu et al. | |
| 2013/0019131 A1 | 1/2013 | Tetzlaff et al. | |
| 2013/0191854 A1 | 7/2013 | Zievers | |
| 2013/0194286 A1 | 8/2013 | Bourd et al. | |
| 2014/0281121 A1 | 9/2014 | Karamcheti et al. | |
| 2014/0359219 A1* | 12/2014 | Evans | G06F 12/0802 711/118 |
| 2015/0268875 A1 | 9/2015 | Jeddeloh | |
| 2016/0054933 A1 | 2/2016 | Haghighi et al. | |
| 2016/0062921 A1 | 3/2016 | Kim et al. | |
| 2017/0017576 A1 | 1/2017 | Cammarota et al. | |
| 2017/0212724 A1 | 7/2017 | Howard et al. | |
| 2018/0107406 A1* | 4/2018 | O | G06F 3/0683 |
| 2018/0260220 A1 | 9/2018 | Lacy et al. | |
| 2018/0341588 A1 | 11/2018 | Ramanujan et al. | |
| 2019/0042145 A1 | 2/2019 | Pham et al. | |
| 2019/0057302 A1 | 2/2019 | Cho et al. | |
| 2019/0057303 A1 | 2/2019 | Burger | |
| 2019/0087708 A1 | 3/2019 | Goulding et al. | |
| 2019/0146788 A1 | 5/2019 | Kim | |
| 2019/0188386 A1 | 6/2019 | Pogorelik et al. | |
| 2019/0272119 A1 | 9/2019 | Brewer | |
| 2019/0273782 A1* | 9/2019 | Kulkarni | H04L 67/28 |
| 2019/0278518 A1 | 9/2019 | Byun et al. | |
| 2019/0303300 A1 | 10/2019 | Boyd et al. | |
| 2019/0347559 A1 | 11/2019 | Kang et al. | |
| 2019/0354842 A1 | 11/2019 | Louizos et al. | |
| 2020/0050385 A1 | 2/2020 | Furey et al. | |
| 2021/0081141 A1 | 3/2021 | Curewitz et al. | |
| 2021/0081318 A1 | 3/2021 | Akel et al. | |
| 2021/0081336 A1 | 3/2021 | Bradshaw et al. | |
| 2021/0081353 A1 | 3/2021 | Eno et al. | |
| 2022/0050639 A1 | 2/2022 | Curewitz et al. | |
| 2022/0050662 A1 | 2/2022 | Howard et al. | |

OTHER PUBLICATIONS

International Search Report and Written Opinion, PCT/US2020/049938, dated Dec. 21, 2020.

International Search Report and Written Opinion, PCT/US2020/049940, dated Dec. 22, 2020.

International Search Report and Written Opinion, PCT/US2020/050712, dated Dec. 21, 2020.

International Search Report and Written Opinion, PCT/US2020/050713, dated Dec. 21, 2020.

Mohsen Imani, et al. "RAPIDNN: In-Memory Deep Neural Network Acceleration Framework." arXiv: 1806.05794v4, Apr. 11, 2019.

* cited by examiner

MEMORY CHIP CONNECTING A SYSTEM ON A CHIP AND AN ACCELERATOR CHIP

FIELD OF THE TECHNOLOGY

At least some embodiments disclosed herein relate to a memory chip connecting a SoC and an accelerator chip (e.g., an AI accelerator chip). At least some embodiments disclosed herein relate to using memory hierarchy and a string of memory chips to form a memory.

BACKGROUND

Memory, such as main memory, is computer hardware that stores information for immediate use in a computer or computing device. Memory in general operates at a higher speed than computer storage. Computer storage provides slower speeds for accessing information, but also can provide higher capacities and better data reliability. Random-access memory (RAM), which is a type of memory, can have high operation speeds.

Typically, memory is made up of addressable semiconductor memory units or cells. A memory IC and its memory units can be at least partially implemented by silicon-based metal-oxide-semiconductor field-effect transistors (MOSFETs).

There are two main types of memory, volatile and non-volatile. Non-volatile memory can include flash memory (which can also be used as storage) as well as ROM, PROM, EPROM and EEPROM (which can be used for storing firmware). Another type of non-volatile memory is non-volatile random-access memory (NVRAM). Volatile memory can include main memory technologies such as dynamic random-access memory (DRAM), and cache memory which is usually implemented using static random-access memory (SRAM).

An AI accelerator is a type of microprocessor or computer system configured to accelerate computations for AI applications, including AI applications such as artificial neural networks, machine vision, and machine learning. AI accelerators can be hardwired to improve data processing for data-intensive or sensor-driven tasks. AI accelerators can include one or more cores and can be wired for low-precision arithmetic and in-memory computing. AI accelerators can be found in many devices such as smartphones, tablets, and any type of computer (especially computers with sensors and data-intensive tasks such as graphics and optics processing). Also, AI accelerators can include vector processors or array processors to improve performance on numerical simulations and other types of tasks used in AI applications.

A SoC is an integrated circuit (IC) that integrates computer components in a single chip. Computer components common in a SoC include a central processing unit (CPU), memory, input/output ports and secondary storage. A SoC can have all its components on a single substrate or microchip, and some chips can be smaller than a quarter. A SoC can include various signal processing functions and can include specialty processors or co-processors such as graphics processing unit (GPU). By being tightly integrated, a SoC can consume much less power than conventional multichip systems of equivalent functionality. This makes a SoC beneficial for integration of mobile computing devices (such as in smartphones and tablets). Also, a SoC can be useful for embedded systems and the Internet of Things (especially when the smart device is small).

Referring back to memory, memory of a computing system can be hierarchical. Often referred to as memory hierarchy in computer architecture, memory hierarchy can separate computer memory into a hierarchy based on certain factors such as response time, complexity, capacity, persistence and memory bandwidth. Such factors can be related and can often be tradeoffs which further emphasizes the usefulness of a memory hierarchy.

In general, memory hierarchy affects performance in a computer system. Prioritizing memory bandwidth and speed over other factors can require considering the restrictions of a memory hierarchy, such as response time, complexity, capacity, and persistence. To manage such prioritization, different types of memory chips can be combined to balance chips that are faster with chips that are more reliable or cost effective, etc. Each of the various chips can be viewed as part of a memory hierarchy. And, for example, to reduce latency on faster chips, other chips in a memory chip combination can respond by filling a buffer and then signaling for activating the transfer of data between chips.

Memory hierarchy can be made of up of chips with different types of memory units or cells. For example, memory cells can be DRAM units. DRAM is a type of random access semiconductor memory that stores each bit of data in a memory cell, which usually includes a capacitor and a MOSFET. The capacitor can either be charged or discharged which represents two values of a bit, such as "0" and "1". In DRAM, the electric charge on a capacitor leaks off, so DRAM requires an external memory refresh circuit which periodically rewrites the data in the capacitors by restoring the original charge per capacitor. DRAM is considered volatile memory since it loses its data rapidly when power is removed. This is different from flash memory and other types of non-volatile memory, such as NVRAM, in which data storage is more persistent.

A type of NVRAM is 3D XPoint memory. With 3D XPoint memory, memory units store bits based on a change of bulk resistance, in conjunction with a stackable cross-gridded data access array. 3D XPoint memory can be more cost effective than DRAM but less cost effective than flash memory. Also, 3D XPoint is non-volatile memory and random-access memory.

Flash memory is another type of non-volatile memory. An advantage of flash memory is that is can be electrically erased and reprogrammed. Flash memory is considered to have two main types, NAND-type flash memory and NOR-type flash memory, which are named after the NAND and NOR logic gates that can implement the memory units of flash memory. The flash memory units or cells exhibit internal characteristics similar to those of the corresponding gates. A NAND-type flash memory includes NAND gates. A NOR-type flash memory includes NOR gates. NAND-type flash memory may be written and read in blocks which can be smaller than the entire device. NOR-type flash permits a single byte to be written to an erased location or read independently. Because of advantages of NAND-type flash memory, such memory has been often utilized for memory cards, USB flash drives, and solid-state drives. However, a primary tradeoff of using flash memory in general is that it is only capable of a relatively small number of write cycles in a specific block compared to other types of memory such as DRAM and NVRAM.

BRIEF DESCRIPTION OF THE DRAWINGS

The present disclosure will be understood more fully from the detailed description given below and from the accompanying drawings of various embodiments of the disclosure.

DETAILED DESCRIPTION

At least some embodiments disclosed herein relate to a memory chip (e.g., DRAM) connecting a SoC and an accelerator chip (e.g., an AI accelerator chip). At least some embodiments disclosed herein relate to connecting an accelerator chip (e.g., an AI accelerator chip) to a SoC via a memory chip. The accelerator chip communicates with the SoC indirectly via the memory chip. The data placed in the memory chip connecting the SoC and the accelerator chip by the memory chip is interpreted for requests to the accelerator chip. Also, the SoC may optionally use the memory chip connecting the SoC and the accelerator chip for its operations that do not involve the accelerator chip. Thus, the memory chip connecting the SoC and the accelerator chip can have two general purposes—to be used for the SoC and used for the accelerator chip. For some examples of such embodiments, see first memory chip 402, accelerator chip 404, and SoC 406 depicted in FIGS. 4-7. Also, see SoC 806 and application-specific components 807 shown in FIGS. 8-9. The application-specific components 807 can include the first memory chip 402 and accelerator chip 404 in some embodiments of devices 800 and 900.

As shown in FIGS. 4-7, the memory chip connecting the SoC and the accelerator chip can be logically (and sometimes physically) intermediate to the SoC and the accelerator chip. And, a memory chip for the accelerator that is intermediate to the SoC and the accelerator chip may not require having two sets of pins. In some embodiments, the accelerator chip and the memory chip can be physically on the same bus. However, in no circumstances using the intermediate memory chip does the SoC communicate with the accelerator chip directly via a bus or wiring. Thus, the memory chip connecting the SoC and the accelerator chip is at least logically between the accelerator chip and the SoC. Also, the connection, provided by the memory chip, of the SoC and the accelerator chip may only be a logical connection.

Figure 4:
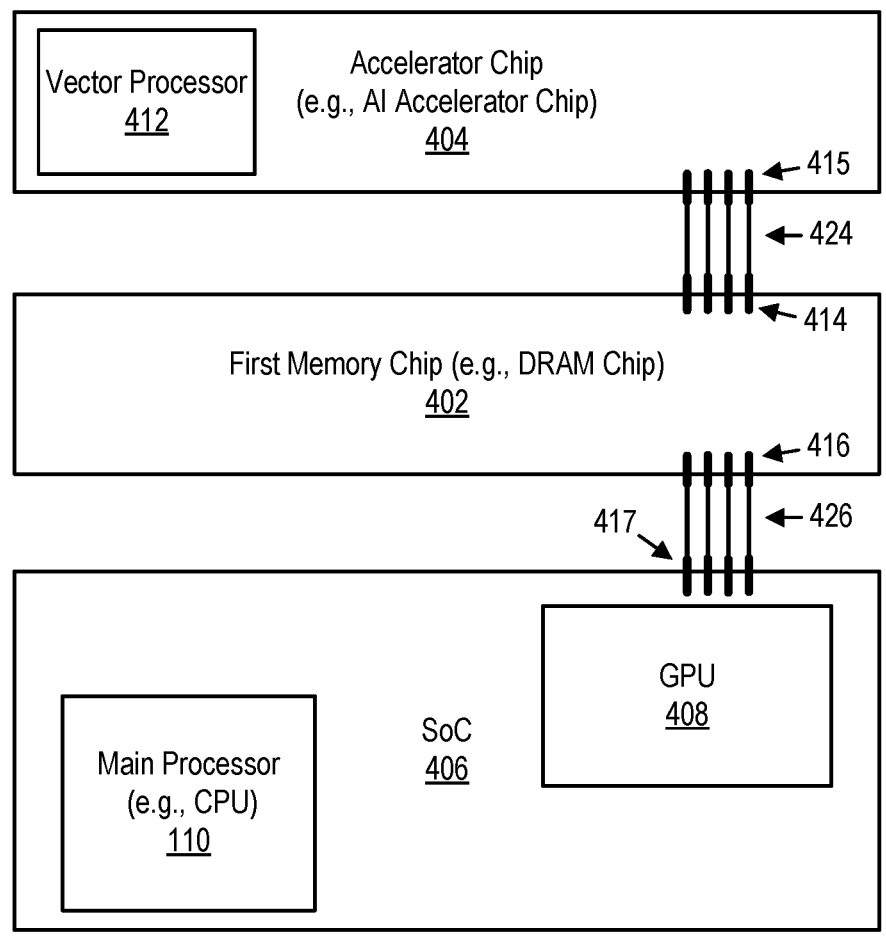
FIG. 4 illustrates an example system, in accordance with some embodiments of the present disclosure, including a memory chip connecting a SoC and an accelerator chip (e.g., an AI accelerator chip).
Figure 5:
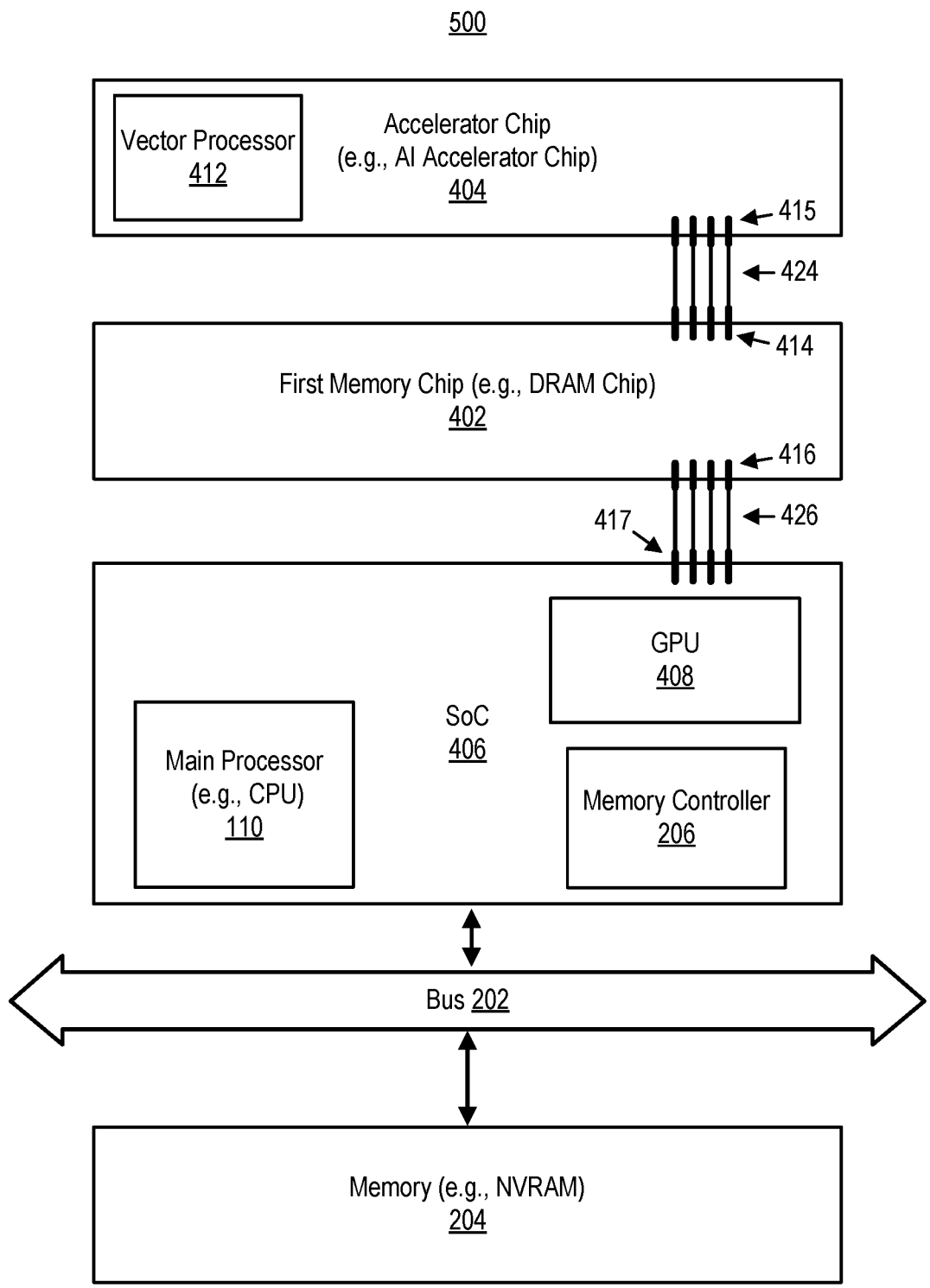
FIGS. 5-7 illustrate example systems including the memory chip depicted in FIG. 4 as well as separate memory.

The memory chip connecting the SoC and the accelerator chip can have two separate sets of pins; one set for connecting to the accelerator chip directly via wiring (e.g., see set of pins 414 and wiring 424 shown in FIGS. 4, 5, and 7) and the other set for connecting to the SoC directly via wiring (e.g., see set of pins 416 and wiring 426 shown in FIGS. 4-5).

The accelerator chip being connected to the SoC via the memory chip can provide acceleration of application-specific computations (such as AI computations) for the SoC in general or more specifically, in some embodiments, for a GPU included in the SoC (e.g., see GPU 408 shown in FIGS. 4-7). In some embodiments, a GPU in the SoC and the memory chip connecting the SoC and the accelerator chip can be connected directly. In some embodiments, the memory chip connecting the GPU and the accelerator chip can include a set of pins and can be connected to the accelerator chip directly via the set of pins and wiring (e.g., see set of pins 414 and wiring 424). The accelerator chip can have a corresponding set of pins too (e.g., see set of pins 415). And, the memory chip connecting the SoC and the accelerator chip can include a second set of pins and can be connected to the GPU directly via the second set of pins and wiring (e.g., see set of pins 416 and wiring 426). Also, the GPU in the SOC can include a set of pins and can be connected to the memory chip directly via the set of pins and wiring (e.g., see set of pins 417 and wiring 426).

For the purposes of this disclosure, it is to be understood that any one of the accelerator chips described herein can be or include a part of a special purpose accelerator chip. Examples of a special purpose accelerator chip can include an artificial intelligence (AI) accelerator chip, a virtual reality accelerator chip, an augmented reality accelerator chip, a graphics accelerator chip, a machine learning accelerator chip, or any other type of ASIC or FPGA that can provide low latency or high bandwidth memory access. For example, any one of the accelerator chips described herein can be or include a part of an AI accelerator chip.

The accelerator chip can be a microprocessor chip or a SoC itself designed for hardware acceleration of AI applications, including artificial neural networks, machine vision, and machine learning. In some embodiments, the accelerator chip is configured to perform numerical calculations on vectors and matrices (e.g., see vector processor 412 shown in FIG. 4, which can be configured to perform the numerical calculations on vectors and matrices). The accelerator chip can be or include an ASIC or FPGA. With ASIC embodiments of the accelerator chip, the accelerator chip can specifically hardwired for acceleration of application-specific computations (such as AI computations). In some other embodiments, the accelerator chip can be a modified FPGA or GPU modified for acceleration of application-specific computations beyond an unmodified FPGA or GPU. In some other embodiments, the accelerator chip can be an unmodified FPGA or GPU.

The memory chips connected directly to the accelerator chip, e.g., see first memory chip 402, are also referred to herein as application-specific memory chips for the sake of clarity when describing multiple memory chips of the overall system. The application-specific memory chips are not necessarily hardwired specifically for application-specific computations (e.g., AI computations). Each of the application-specific memory chips can be a DRAM chip or a NVRAM chip. And, each of the application-specific memory chips can be connected directly to the accelerator chip and can have memory units specifically for the acceleration of application-specific computations by the accelerator after the application-specific memory chip is configured by the SoC or the accelerator chip.

In some embodiments, the SoC can include a main processor (e.g., CPU). For example, see main processor 110 shown in FIGS. 4-7. In such embodiments, the GPU in the SoC can run instructions for application-specific tasks and computations (e.g., AI tasks and computations), and the main processor can run instructions for non-application-specific tasks and computations (e.g., non-AI tasks and computations). And, in such embodiments, the accelerator can provide acceleration of application-specific tasks and computations for the GPU specifically. The SoC can also include its own bus for connecting components of the SoC to each other (such as connecting the main processor and the GPU). Also, the bus of the SoC can be configured to connect the SoC to a bus external to the SoC so that the components of the SoC can couple with chips and devices external to the SoC such as a separate memory chip.

The non-application-specific computations and tasks (e.g., non-AI computations and tasks) of the GPU or such computations and tasks not using the accelerator chip, which may not be conventional tasks performed by the main processor, can use separate memory such as a separate memory chip (which can be application-specific memory). And, the memory can be implemented by DRAM, NVRAM, flash memory, or any combination thereof. For example, a separate memory or memory chip can be connected to the SoC and the main processor via a bus external to the SoC (e.g., see memory 204 and bus 202 depicted in FIG. 5). In such embodiments, the separate memory or memory chip can have memory units specifically for the main processor. Also, a separate memory or memory chip can be connected to the SoC and the GPU via the bus external to the SoC (e.g., see second memory chip 204 and bus 202 depicted in FIGS. 5-7). In such embodiments, the separate memory or memory chip can have memory units for the main processor or the GPU.

Figure 10:
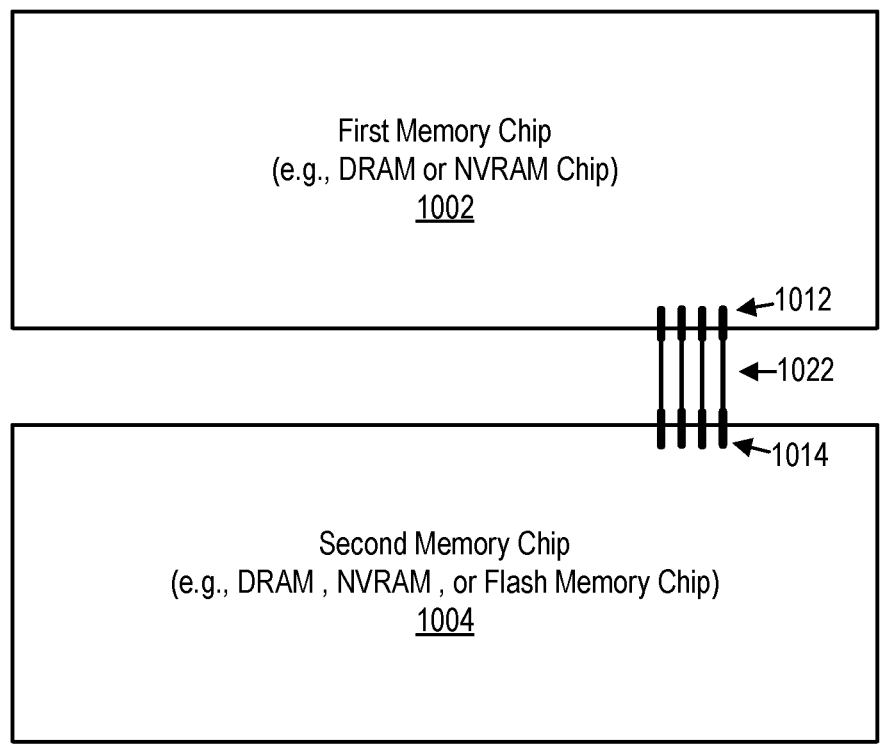
FIGS. 10 and 11 illustrate example strings of memory chips that can be used in the separate memory depicted in FIGS. 2-3 and 5-7.
Figure 11:
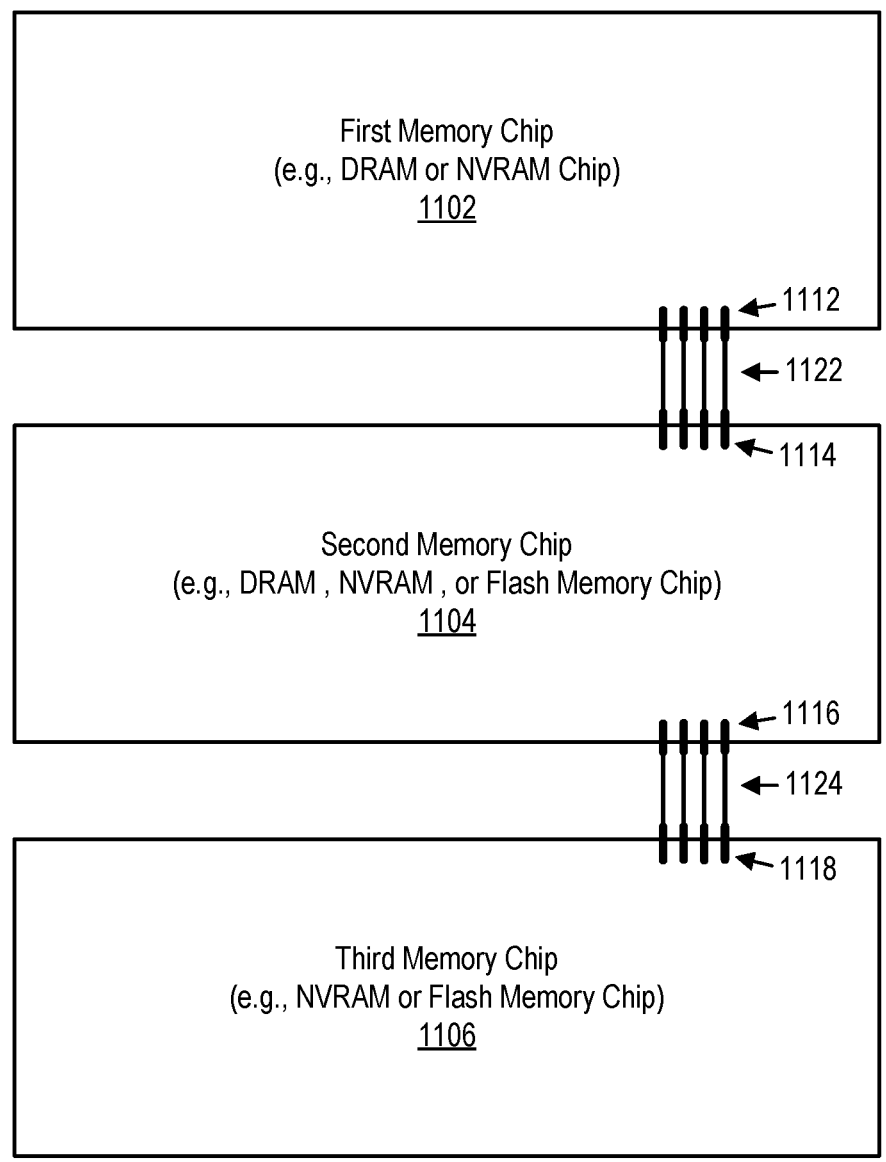

It is to be understood for the purposes of this disclosure that the application-specific memory chip and the separate memory chip can each be substituted by a group of memory chips such as a string of memory chips (e.g., see the strings of memory chips shown in FIGS. 10 and 11). For example, the separate memory chip can be substituted by a string of memory chips that includes at least a NVRAM chip and a flash memory chip downstream of the NVRAM chip. Also, the separate memory chip can be substituted by at least two memory chips where one of the chips is for the main processor (e.g., CPU) and the other chip is for the GPU for use as memory for non-AI computations and/or tasks.

Additionally, at least some embodiments disclosed herein relate to an accelerator chip (e.g., an AI accelerator chip) having a vector processor (e.g., see vector processor 412 shown in FIGS. 4-7). And, at least some embodiments disclosed herein relate to using memory hierarchy and a string of memory chips to form a memory (e.g., see FIGS. 10 and 11).

For the purposes of this disclosure, it is to be understood that any one of the accelerator chips described herein can be or include a part of a special purpose accelerator chip. Examples of a special purpose accelerator chip can include an AI accelerator chip, a virtual reality accelerator chip, an augmented reality accelerator chip, a graphics accelerator chip, a machine learning accelerator chip, or any other type of ASIC or FPGA that can provide low latency or high bandwidth memory access.

Figure 1:
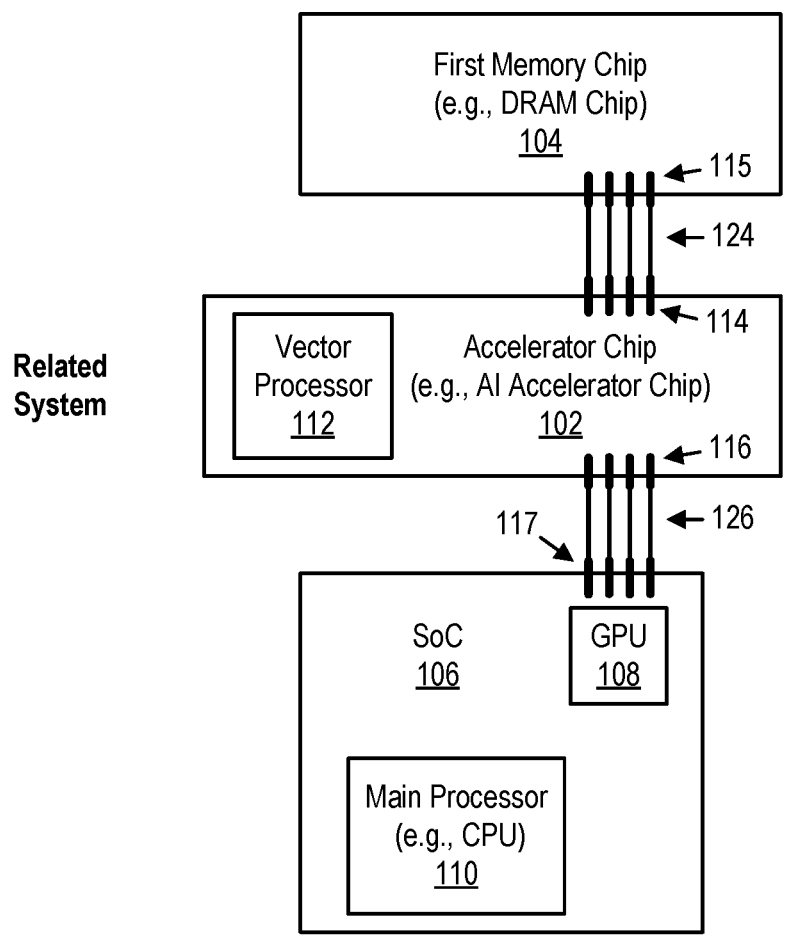
FIG. 1 illustrates an example related system including an accelerator chip (e.g., an AI accelerator chip) connecting a SoC and a memory chip.

FIG. 1 illustrates an example related system including an accelerator chip (e.g., an AI accelerator chip) connecting a SoC and a memory chip.

FIG. 1 illustrates an example system 100, which is to some extend related to system 400. System 100 includes an accelerator chip 102 (e.g., an AI accelerator chip) connecting a first memory chip 104 and a SoC 106. As shown, the SoC 106 includes a GPU 108 as well as a main processor 110.

The main processor 110 can be or include a CPU. And, the accelerator chip 102 includes a vector processor 112.

In system 100, the accelerator chip 102 includes a first set of pins 114 and a second set of pins 116. The first set of pins 114 is configured to connect to the first memory chip 104 via wiring 124. The second set of pins 116 is configured to connect to the SoC 106 via wiring 126. As shown, the first memory chip 104 includes a corresponding set of pins 115 that connects the memory chip to the accelerator chip 102 via wiring 124. The GPU 108 of the SoC 106 includes a corresponding set of pins 117 that connects the SoC to the accelerator chip 102 via wiring 126.

The accelerator chip 102 is configured to perform and accelerate application-specific computations (e.g., AI computations) for the SoC 106. The accelerator chip 102 is also configured to use the first memory chip 104 as memory for the application-specific computations. The acceleration of application-specific computations can be performed by the vector processor 112. The vector processor 112 in the accelerator chip 102 can be configured to perform numerical calculations on vectors and matrices for the SoC 106. The accelerator chip 102 can include an ASIC that includes the vector processor 112 and is specifically hardwired to accelerate application-specific computations (e.g., AI computations) through the vector processor 112. Alternatively, the accelerator chip 102 can include FPGA that include the vector processor 112 and are specifically hardwired to accelerate application-specific computations through the vector processor 112. In some embodiments, the accelerator chip 102 can include a GPU that includes the vector processor 112 and is specifically hardwired to accelerate application-specific computations through the vector processor 112. In such embodiments, the GPU can be specifically modified to accelerate application-specific computations through the vector processor 112.

As shown, the SoC 106 includes a GPU 108. And, the accelerator chip 102 can be configured to perform and accelerate application-specific computations (e.g., AI computations) for the GPU 108. For example, the vector processor 112 can be configured to perform numerical calculations on vectors and matrices for the GPU 108. Also, the GPU 108 can be configured to perform application-specific tasks and computations (e.g., AI tasks and computations).

Also, as shown, the SoC 106 includes a main processor 110 that is configured to perform non-AI tasks and computations.

In some embodiments, the memory chip 104 is a DRAM chip. In such examples, the first set of pins 114 can be configured to connect to the DRAM chip via wiring 124. Also, the accelerator chip 102 can be configured to use DRAM cells in the DRAM chip as memory for the application-specific computations (e.g., AI computations). In some other embodiments, the memory chip 104 is a NVRAM chip. In such embodiments, the first set of pins 114 can be configured to connect to the NVRAM chip via wiring 124. Also, the accelerator chip 102 can be configured to use NVRAM cells in the NVRAM chip as memory for the application-specific computations. Further, the NVRAM chip can be or include a 3D XPoint memory chip. In such examples, the first set of pins 114 can be configured to connect to the 3D XPoint memory chip via wiring 124 and the accelerator chip 102 can be configured to use 3D XPoint memory cells in the 3D XPoint memory chip as memory for the application-specific computations.

In some embodiments, the system 100 includes the accelerator chip 102 that is connected, via wiring, to the first memory chip 104, and the first memory chip 104 can be an application-specific memory chip. The system 100 also includes SoC 106 that includes GPU 108 (which can be configured to perform AI tasks) and main processor 110 (which can be configured to perform non-AI tasks and delegate the AI tasks to the GPU 108). In such embodiments, GPU 108 includes set of pins 117 configured to connect to accelerator chip 102 via wiring 126, and the accelerator chip 102 is configured to perform and accelerate AI computations of the AI tasks for the GPU 108.

In such embodiments, the accelerator chip 102 can include vector processor 112 that is configured to perform numerical calculations on vectors and matrices for the GPU 108. And, the accelerator chip 102 includes an ASIC that includes the vector processor 112 and is specifically hardwired to accelerate AI computations through the vector processor 112. Or, the accelerator chip 102 includes FPGA that include vector processor 112 and are specifically hardwired to accelerate AI computations through the vector processor 112. Or, the accelerator chip 102 includes a GPU that includes the vector processor 112 and is specifically hardwired to accelerate AI computations through the vector processor 112.

The system 100 also includes memory chip 104, and the accelerator chip 102 can be connected, via wiring 124, to the memory chip 104 and be configured to perform and accelerate AI computations of AI tasks. The memory chip 104 can be or include a DRAM chip having DRAM cells, and the DRAM cells can be configured, by the accelerator chip 102, to store data for acceleration of AI computations. Or, the memory chip 104 can be or include a NVRAM chip having NVRAM cells, and the NVRAM cells can be configured, by the accelerator chip 102, to store data for acceleration of AI computations. The NVRAM chip can include 3D XPoint memory cells, and the 3D XPoint memory cells can be configured, by the accelerator chip 102, to store data for acceleration of AI computations.

Figure 2:
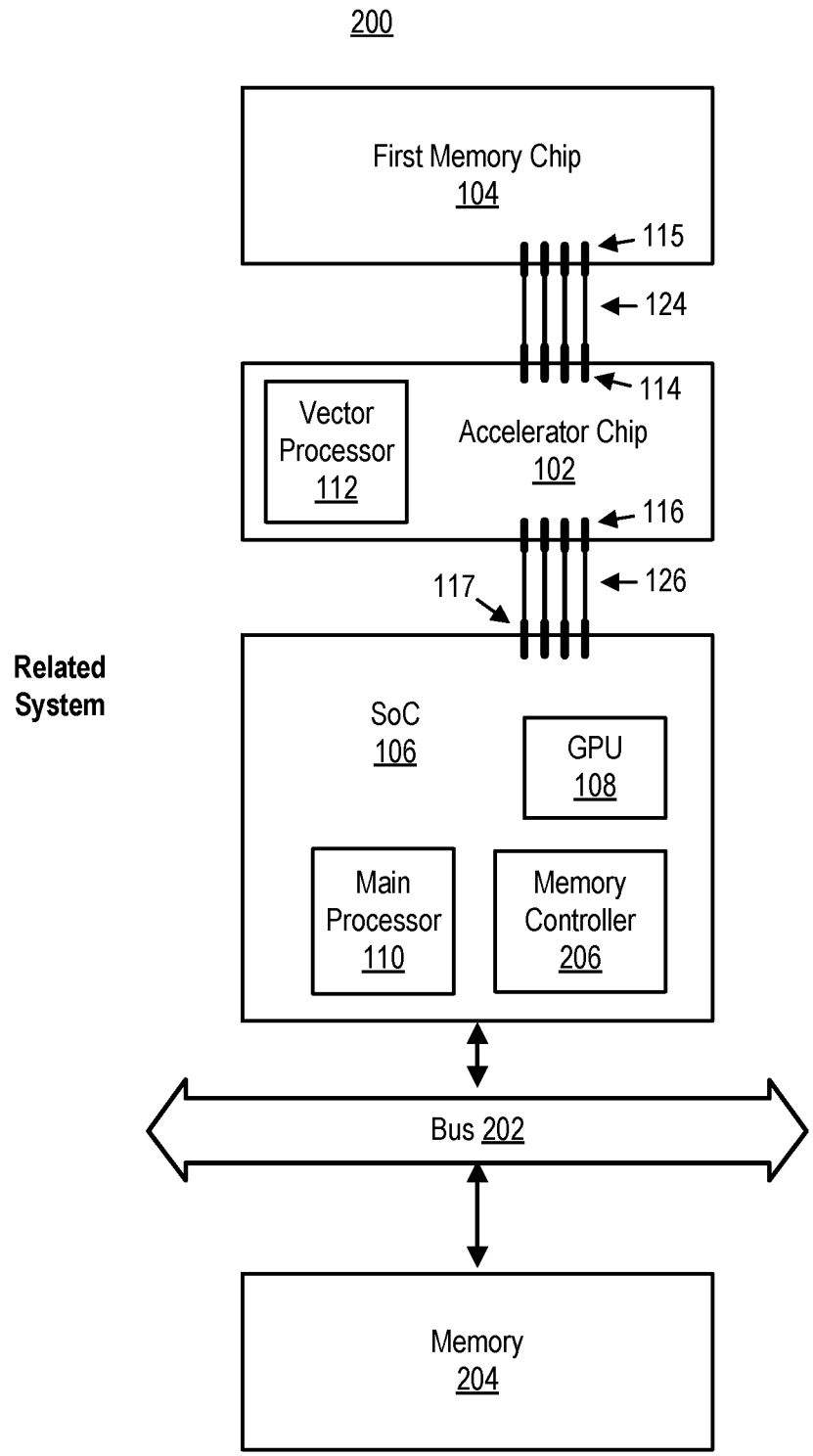
FIGS. 2-3 illustrate example related systems including the accelerator chip depicted in FIG. 1 as well as separate memory.
Figure 3:
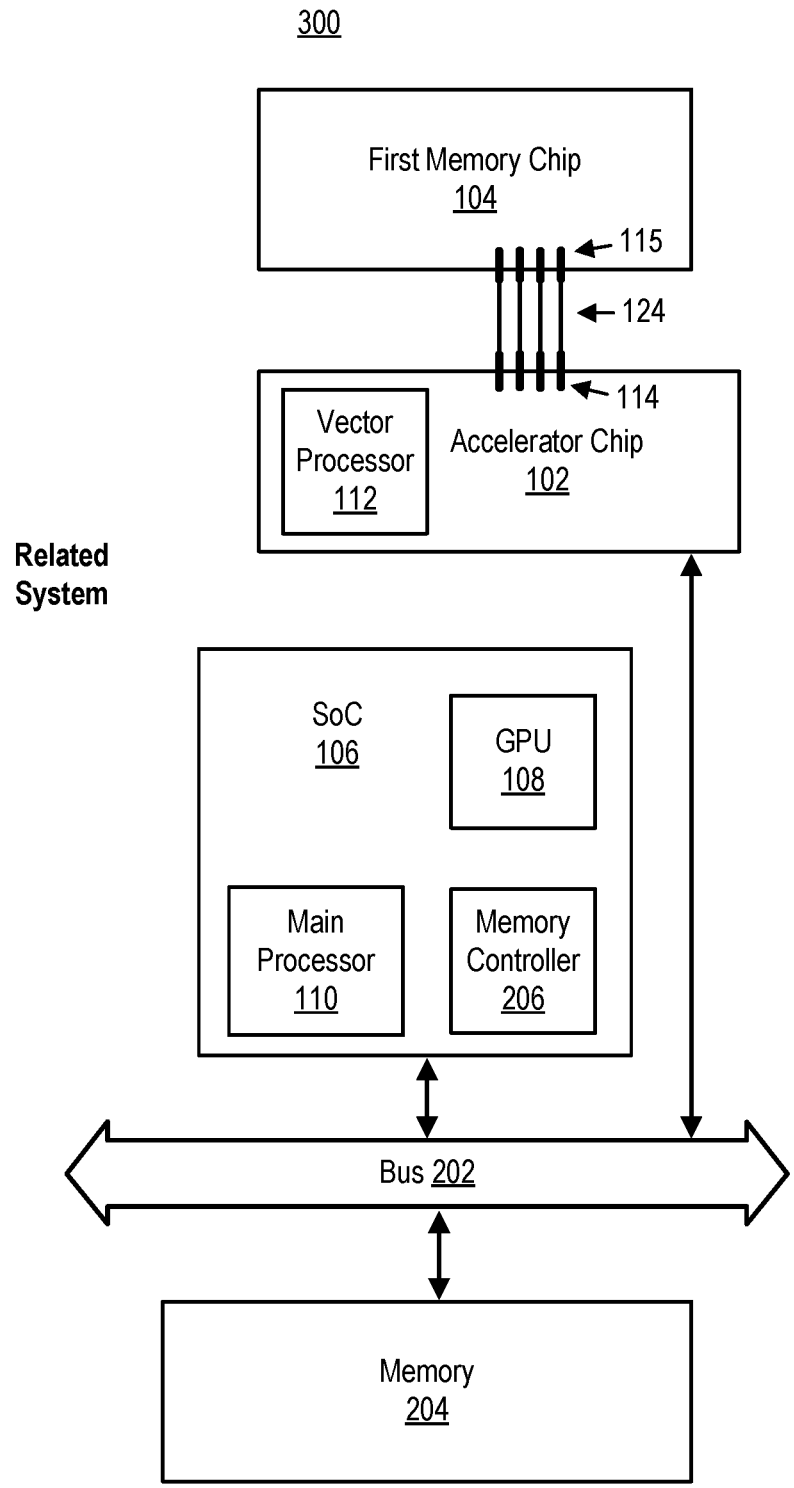

FIGS. 2-3 illustrate example systems 200 and 300 respectively, each system including the accelerator chip 102 depicted in FIG. 1 as well as separate memory (e.g., NVRAM).

In FIG. 2, a bus 202 connects the system 100 (including the accelerator chip 102) with memory 204. The memory 204, which can be NVRAM in some embodiments, is separate memory from the memory of first memory chip 104 of system 100. And, memory 204 can be main memory in some embodiments.

In the system 200, the SoC 106 of the system 100 is connected with the memory 204 via the bus 202. And, the system 100 as part of system 200 includes the accelerator chip 102, the first memory chip 104, and the SoC 106. These parts of system 100 are connected to the memory 204 via bus 202. Also, shown in FIG. 2, a memory controller 206 included in the SoC 106 controls data access of the memory 204 by the SoC 106 of system 100. For example, the memory controller 206 controls data access of the memory 204 by the GPU 108 and/or the main processor 110. In some embodiments, the memory controller 206 can control data access of all memory in the system 200 (such as data access of the first memory chip 104 and the memory 204). And, the memory controller 206 can be communicatively coupled to the first memory chip 104 and/or the memory 204.

The memory 204 is separate memory from the memory provided by the first memory chip 104 of system 100, and it can be used as memory for the GPU 108 and the main processor 110 of the SoC 106 via the memory controller 206 and the bus 202. Also, memory 204 can be used as memory for non-application-specific tasks or application-specific tasks (such as non-AI tasks or AI tasks) not performed by the accelerator chip 102, for the GPU 108 and the main processor 110. Data for such tasks can be accessed and communicated to and from memory 204 via memory controller 206 and bus 202.

In some embodiments, memory 204 is main memory of a device, such as a device that hosts system 200. For example, with the system 200, memory 204 can be the main memory 808 shown in FIG. 8.

In FIG. 3, the bus 202 connects the system 100 (including the accelerator chip 102) with the memory 204. Also, in system 300, the bus 202 connects the accelerator chip 102 to the SoC 106 as well as the accelerator chip 102 to the memory 204. Also shown, in system 300, the bus 202 has replaced the second set of pins 116 of the accelerator chip as well as the wiring 126 and the set of pins 117 of the SoC 106 and GPU 108. The accelerator chip 102 in system 300, similar to system 200, connects the first memory chip 104 and the SoC 106 of system 100; however, the connection is through the first set of pins 114 and the bus 202.

Also, similar to system 200, in system 300, the memory 204 is separate memory from the memory of first memory chip 104 of system 100. In the system 300, the SoC 106 of the system 100 is connected with the memory 204 via the bus 202. And, in system 300, the system 100 as part of system 300 includes the accelerator chip 102, the first memory chip 104, and the SoC 106. These parts of system 100 are connected to the memory 204 via bus 202 in system 300. Also, similar, as shown in FIG. 3, a memory controller 206 included in the SoC 106 controls data access of the memory 204 by the SoC 106 of system 100. In some embodiments, the memory controller 206 can control data access of all memory in the system 300 (such as data access of the first memory chip 104 and the memory 204). And, the memory controller can be connected to the first memory chip 104 and/or the memory 204. And, the memory controller 206 can be communicatively coupled to the first memory chip 104 and/or the memory 204.

Also, in system 300, the memory 204 (which can be NVRAM in some embodiments) is separate memory from the memory provided by the first memory chip 104 of system 100, and it can be used as memory for the GPU 108 and the main processor 110 of the SoC 106 via the memory controller 206 and the bus 202. Further, the accelerator chip 102 can use the memory 204 via the bus 202, in some embodiments and situations. And, memory 204 can be used as memory for non-application-specific tasks or application-specific tasks (such as non-AI tasks or AI tasks) not performed by the accelerator chip 102 for the GPU 108 and the main processor 110. Data for such tasks can be accessed and communicated to and from memory 204 via memory controller 206 and/or bus 202.

In some embodiments, memory 204 is main memory of a device, such as a device that hosts system 300. For example, with the system 300, memory 204 can be the main memory 808 shown in FIG. 9.

FIG. 4 illustrates an example system 400 including a first memory chip 402 connecting an accelerator chip 404 (e.g., an AI accelerator chip) and a SoC 406, in accordance with some embodiments of the present disclosure. As shown, the SoC 406 includes a GPU 408 as well as main processor 110. The main processor 110 can be or include a CPU in system 400. And, the accelerator chip 404 includes a vector processor 412.

In system 400, the memory chip 402 includes a first set of pins 414 and a second set of pins 416. The first set of pins 414 is configured to connect to the accelerator chip 404 via wiring 424. The second set of pins 416 is configured to connect to the SoC 406 via wiring 426. As shown, the accelerator chip 404 includes a corresponding set of pins 415 that connects the first memory chip 402 to the accelerator chip via wiring 424. The GPU 408 of the SoC 406 includes a corresponding set of pins 417 that connects the SoC to the first memory chip 402 via wiring 426.

The first memory chip 402 includes a first plurality of memory cells configured to store and provide computational input data (e.g., AI computation input data) received from the SoC 406, via the second set of pins 416, to be used by the accelerator chip 404 as computation input (e.g., AI computation input). The computation input data is accessed from the first plurality of memory cells and transmitted from the first memory chip 402, via the first set of pins 414, to be received and used by the accelerator chip 404. The first plurality of memory cells can include DRAM cells and/or NVRAM cells. In examples having NVRAM cells, the NVRAM cells can be or include 3D XPoint memory cells.

The first memory chip 402 also includes a second plurality of memory cells configured to store and provide computation output data (e.g., AI computation output data) received from the accelerator chip 404, via the first set of pins 414, to be retrieved by the SoC 406 or reused by the accelerator chip 404 as computation input (e.g., AI computation input). The computation output data can be accessed from the second plurality of memory cells and transmitted from the first memory chip 402, via the first set of pins 414, to be received and used by the accelerator chip 404. Also, the computation output data can be accessed from the second plurality of memory cells and transmitted from the SoC 406 or the GPU 408 in the SoC, via the second set of pins 416, to be received and used by the SoC or the GPU in the SoC. The second plurality of memory cells can include DRAM cells and/or NVRAM cells. In examples having NVRAM cells, the NVRAM cells can be or include 3D XPoint memory cells.

The first memory chip 402 also includes a third plurality of memory cells configured to store non-AI data related to non-AI tasks received from the SoC 406, via the set of pins 416, to be retrieved by the SoC 406 for non-AI tasks. The non-AI data can be accessed from the third plurality of memory cells and transmitted from the first memory chip 402, via the second set of pins 416, to be received and used by the SoC 406, the GPU 408 in the SoC, or the main processor 110 in the SoC. The third plurality of memory cells can include DRAM cells and/or NVRAM cells. In examples having NVRAM cells, the NVRAM cells can be or include 3D XPoint memory cells.

The accelerator chip 404 is configured to perform and accelerate application-specific computations (e.g., AI computations) for the SoC 406. The accelerator chip 404 is also configured to use the first memory chip 402 as memory for the application-specific computations. The acceleration of application-specific computations can be performed by the vector processor 412. The vector processor 412 in the accelerator chip 404 can be configured to perform numerical calculations on vectors and matrices for the SoC 406. For example, the vector processor 412 can be configured to perform numerical calculations on vectors and matrices for the SoC 406 using the first and second pluralities of memory cells as memory.

The accelerator chip 404 can include an ASIC that includes the vector processor 412 and is specifically hardwired to accelerate application-specific computations (e.g., AI computations) through the vector processor 412. Alternatively, the accelerator chip 404 can include FPGA that include the vector processor 412 and are specifically hardwired to accelerate application-specific computations through the vector processor 412. In some embodiments, the accelerator chip 404 can include a GPU that includes the vector processor 412 and is specifically hardwired to accelerate application-specific computations through the vector processor 412. In such embodiments, the GPU can be specifically modified to accelerate application-specific computations through the vector processor 412.

As shown, the SoC 406 includes a GPU 408. And, the accelerator chip 402 can be configured to perform and accelerate application-specific computations for the GPU 408. For example, the vector processor 412 can be configured to perform numerical calculations on vectors and matrices for the GPU 408. Also, the GPU 408 can be configured to perform application-specific tasks and computations. Also, as shown, the SoC 406 includes a main processor 110 that is configured to perform non-AI tasks and computations.

In some embodiments, the system 400 includes memory chip 402, accelerator chip 404, and SoC 406, and the memory chip 402 includes at least the first set of pins 414 configured to connect to the accelerator chip 404 via wiring 424 and the second set of pins 416 configured to connect to the SoC 406 via wiring 426. And, the memory chip 402 can include the first plurality of memory cells configured to store and provide AI computation input data received from the SoC 406, via the set of pins 416, to be used by the accelerator chip 404 as AI computation input, as well as the second plurality of memory cells configured to store and provide AI computation output data received from the accelerator chip 404, via the other set of pins 414, to be retrieved by the SoC 406 or reused by the accelerator chip 404 as AI computation input. And the memory chip 402 can include the third plurality of cells used for memory for non-AI computations.

Also, the SoC 406 includes GPU 408, and the accelerator chip 404 can be configured to perform and accelerate AI computations for the GPU 408 using the first and second pluralities of memory cells as memory. And, the accelerator chip 404 includes a vector processor 412 that can be configured to perform numerical calculations on vectors and matrices for the SoC 406 using the first and second pluralities of memory cells as memory.

Also, in the system 400, the first plurality of memory cells in the memory chip 402 can be configured to store and provide AI computation input data received from the SoC 406, via the set of pins 416, to be used by an accelerator chip 404 (e.g., an AI accelerator chip) as AI computation input. And, the second plurality of memory cells in the memory chip 402 can be configured to store and provide AI computation output data received from the accelerator chip 404, via the other set of pins 414, to be retrieved by the SoC 406 or reused by the accelerator chip 404 as AI computation input. And, the third plurality of memory cells in the memory chip 402 can be configured to store non-AI data related to non-AI tasks received from the SoC 406, via the set of pins 416, to be retrieved by the SoC 406 for non-AI tasks.

The first, second, and third pluralities of memory cells in the memory chip 402 each can include DRAM cells and/or NVRAM cells and the NVRAM cells can include 3D XPoint memory cells.

Figure 6:
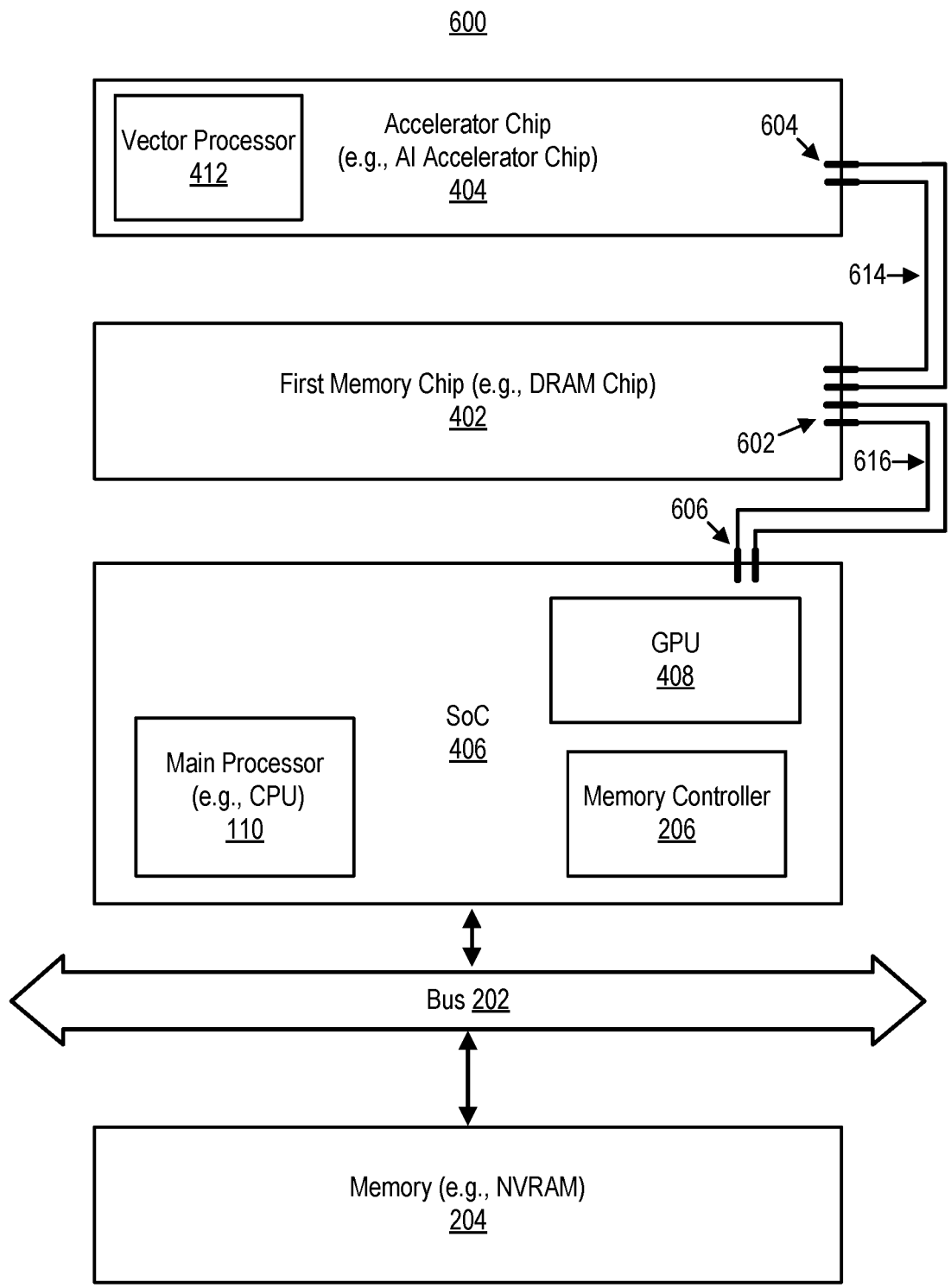
Figure 7:
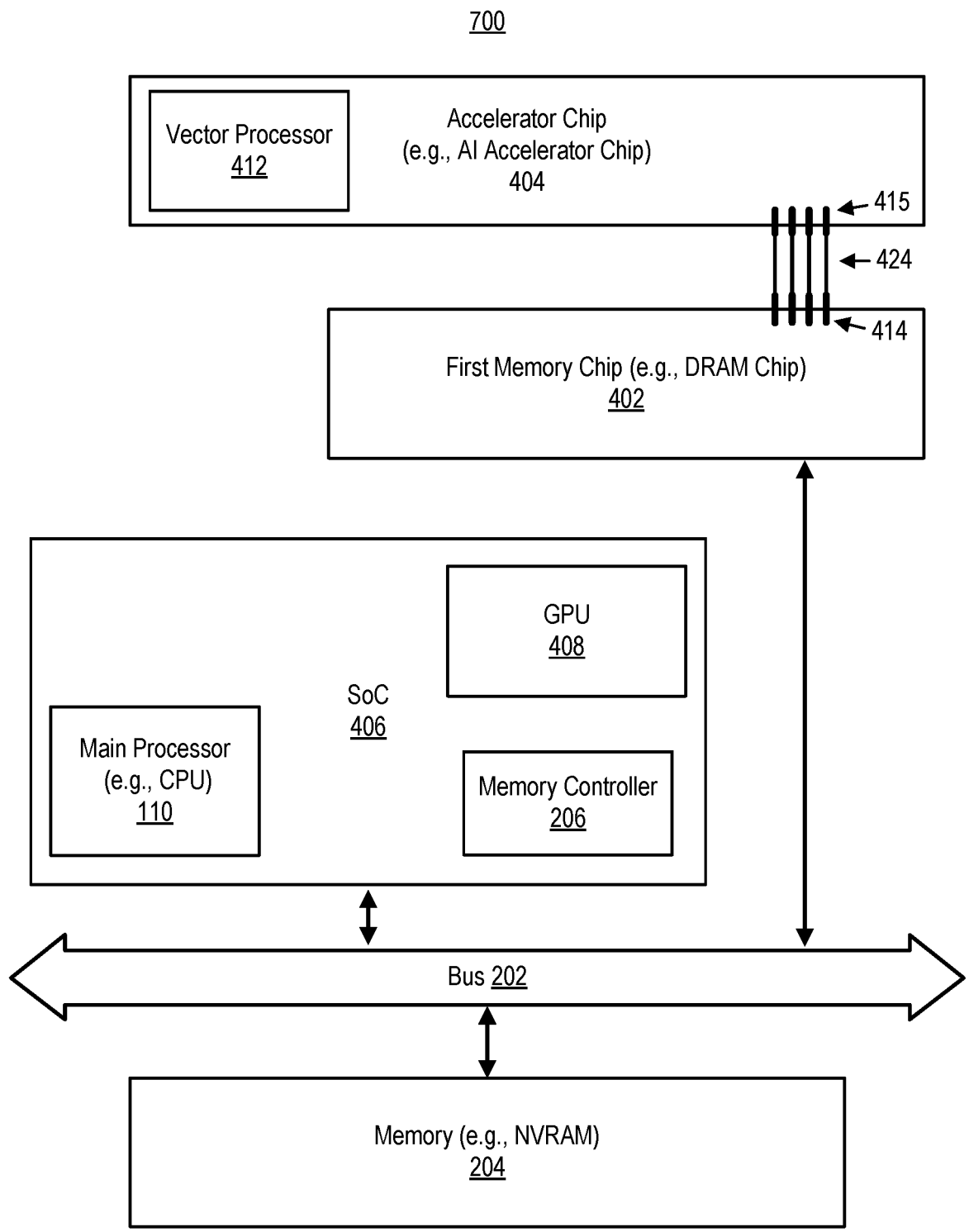

FIGS. 5-7 illustrate example systems 500, 600, and 700 respectively, each system includes the memory chip 402 depicted in FIG. 4 as well as separate memory.

In FIG. 5, bus 202 connects the system 400 (including the memory chip 402 and accelerator chip 404) with memory 204. The memory 204 (e.g., NVRAM) is separate memory from the memory of first memory chip 402 of system 400. And, memory 204 can be main memory.

In the system 500, the SoC 406 of the system 400 is connected with the memory 204 via the bus 202. And, the system 400 as part of system 500 includes the first memory chip 402, the accelerator chip 404, and the SoC 406. These parts of system 400 are connected to the memory 204 via bus 202. Also, shown in FIG. 5, a memory controller 206 included in the SoC 406 controls data access of the memory 204 by the SoC 406 of system 400. For example, the memory controller 206 controls data access of the memory 204 by the GPU 408 and/or the main processor 110. In some embodiments, the memory controller 206 can control data access of all memory in the system 500 (such as data access of the first memory chip 402 and the memory 204). And, the memory controller 206 can be communicatively coupled to the first memory chip 402 and/or the memory 204.

The memory 204 is separate memory from the memory provided by the first memory chip 402 of system 400, and it can be used as memory for the GPU 408 and the main processor 110 of the SoC 406 via the memory controller 206 and the bus 202. Also, memory 204 can be used as memory for non-application-specific tasks or application-specific tasks (such as non-AI tasks or AI tasks) not performed by the accelerator chip 404, for the GPU 408 and the main processor 110. Data for such tasks can be accessed and communicated to and from memory 204 via memory controller 206 and bus 202.

In some embodiments, memory 204 is main memory of a device, such as a device that hosts system 500. For example, with the system 500, memory 204 can be the main memory 808 shown in FIG. 8.

In FIG. 6, similar to in FIG. 5, bus 202 connects the system 400 (including the memory chip 402 and accelerator chip 404) with memory 204. Unique to the system 600 with respect to systems 500 and 700, the first memory chip 402 includes a single set of pins 602 that connects the first memory chip 402 to both the accelerator chip 404 and the SoC 406 directly via wiring 614 and 616 respectively. Also shown, in system 600, the accelerator chip 404 includes a single set of pins 604 that connects the accelerator chip 404 to the first memory chip 402 directly via wiring 614. Further, in system 600, the GPU of the SoC includes a set of pins 606 that connects the SoC 406 to the first memory chip 402 directly via wiring 606.

In the system 600, the SoC 406 of the system 400 is connected with the memory 204 via the bus 202. And, the system 400 as part of system 600 includes the first memory chip 402, the accelerator chip 404, and the SoC 406. These parts of system 400 are connected to the memory 204 via bus 202 (e.g., the accelerator chip 404 and the first memory chip 402 having indirect connections to the memory 204 via the SoC 406 and the bus 202, and the SoC 406 having a direct connection to the memory 204 via the bus 202). Also, shown in FIG. 6, a memory controller 206 included in the SoC 406 controls data access of the memory 204 by the SoC 406 of system 400. For example, the memory controller 206 controls data access of the memory 204 by the GPU 408 and/or the main processor 110. In some embodiments, the memory controller 206 can control data access of all memory in the system 600 (such as data access of the first memory chip 402 and the memory 204). And, the memory controller 206 can be communicatively coupled to the first memory chip 402 and/or the memory 204.

The memory 204 is separate memory (e.g., NVRAM) from the memory provided by the first memory chip 402 of system 400, and it can be used as memory for the GPU 408 and the main processor 110 of the SoC 406 via the memory controller 206 and the bus 202. Also, memory 204 can be used as memory for non-application-specific tasks or application-specific tasks (such as non-AI tasks or AI tasks) not performed by the accelerator chip 404, for the GPU 408 and the main processor 110. Data for such tasks can be accessed and communicated to and from memory 204 via memory controller 206 and bus 202.

In some embodiments, memory 204 is main memory of a device, such as a device that hosts system 600. For example, with the system 600, memory 204 can be the main memory 808 shown in FIG. 8.

In FIG. 7, bus 202 connects the system 400 (including the memory chip 402 and accelerator chip 404) with memory 204. Also, in system 700, the bus 202 connects the first memory chip 402 to the SoC 406 as well as the first memory chip 402 to the memory 204. Also shown, in system 700, the bus 202 has replaced the second set of pins 416 of the first memory chip 402 as well as the wiring 426 and the set of pins 417 of the SoC 406 and GPU 408. The first memory chip 402 in system 700, similar to systems 500 and 600, connects the accelerator chip 404 and the SoC 406 of system 400; however, the connection is through the first set of pins 414 and the bus 202.

Also, similar to system systems 500 and 600, in system 700, the memory 204 is separate memory from the memory of first memory chip 402 of system 400. In the system 700, the SoC 406 of the system 400 is connected with the memory 204 via the bus 202. And, in system 700, the system 400 as part of system 700 includes the first memory chip 402, the accelerator chip 404, and the SoC 406. These parts of system 400 are connected to the memory 204 via bus 202 in system 700. Also, similar, as shown in FIG. 7, a memory controller 206 included in the SoC 406 controls data access of the memory 204 by the SoC 406 of system 400. In some embodiments, the memory controller 206 can control data access of all memory in the system 700 (such as data access of the first memory chip 402 and the memory 204). And, the memory controller 206 can be communicatively coupled to the first memory chip 402 and/or the memory 204.

Also, in system 700, the memory 204 is separate memory (e.g., NVRAM) from the memory provided by the first memory chip 402 of system 400, and it can be used as memory for the GPU 408 and the main processor 110 of the SoC 406 via the memory controller 206 and the bus 202. Further, the accelerator chip 404 can use the memory 204 in some embodiments and situations via the first memory chip 402 and the bus 202. In such examples, the first memory chip 402 can include a cache for the accelerator chip 404 and the memory 204. And, memory 204 can be used as memory for non-application-specific tasks or application-specific tasks (such as non-AI tasks or AI tasks) not performed by the accelerator chip 404 for the GPU 408 and the main processor 110. Data for such tasks can be accessed and communicated to and from memory 204 via memory controller 206 and/or bus 202.

In some embodiments, memory 204 is main memory of a device, such as a device that hosts system 700. For example, with the system 700, memory 204 can be the main memory 808 shown in FIG. 9.

Embodiments of accelerator chips disclosed herein (e.g., see accelerator chip 102 and accelerator chip 404 shown in FIGS. 1-3 and 4-7 respectively) can be microprocessor chips or SoCs or the like. The embodiments of the accelerator chips can be designed for hardware acceleration of AI applications, including artificial neural networks, machine vision, and machine learning. In some embodiments, an accelerator chip (e.g., an AI accelerator chip) can be configured to perform numerical calculations on vectors and matrices. In such embodiments, the accelerator chip can include a vector processor to perform numerical calculations on vectors and matrices (e.g., see vector processors 112 and 412 shown in FIGS. 1-3 and 4-7 respectively, which can be configured to perform the numerical calculations on vectors and matrices).

Embodiments of accelerator chips disclosed herein can be or include an ASIC or FPGA. With ASIC embodiments of the accelerator chip, the accelerator chip is specifically hardwired for acceleration of application-specific computations (such as AI computations). In some other embodiments, the accelerator chip can be a modified FPGA or GPU modified for acceleration of application-specific computations (such as AI computations) beyond an unmodified FPGA or GPU. In some other embodiments, the accelerator chip can be an unmodified FPGA or GPU.

An ASIC described herein can include an IC customized for a particular use or application such as acceleration of application-specific computations (such as AI computations). This is different from general-purpose use which is usually implemented by a CPU or another type of general-purpose processor such as a GPU which is generally for processing graphics.

FPGA described herein can be included in an IC designed and/or configured after manufacturing of the IC and FPGA; thus, the IC and FPGA is field-programmable. An FPGA configuration can be specified using a hardware description language (HDL). Likewise, an ASIC configuration can be specified using a HDL.

A GPU described herein can include an IC configured to rapidly manipulate and alter memory to accelerate the generation and updating of images in a frame buffer to be outputted to a display device. And, systems described herein can include a display device connected to the GPU and a frame buffer connected to the display device and GPU. GPUs described herein can be a part of an embedded system, mobile device, personal computer, workstation, or game console, or any device connected to and using a display device.

Embodiments of microprocessor chips described herein are each one or more integrated circuits that incorporate at least the functionality of a central processing unit. Each microprocessor chip can be multipurpose and include at least a clock and registers that implement the chip by accepting binary data as input and processing the data using the registers and clock according to instructions stored in memory connected to the microprocessor chip. Upon processing the data, the microprocessor chip can provide results of the input and instructions as output. And, the output can be provided to the memory connected to the microprocessor chip.

Embodiments of SoCs described herein are each one or more integrated circuits that integrates components of a computer or other electronic system. In some embodiments, the SoC is a single IC. In other embodiments, the SoC can include separated and connected integrated circuits. In some embodiments, the SoC can include its own CPU, memory, input/output ports, secondary storage, or any combination thereof. Such one or more parts can be on a single substrate or microprocessor chip in a SoC described herein. In some embodiments, the SoC is smaller than a quarter, a nickel, or a dime. Some embodiments of the SoCs can be a part of a mobile device (such as a smartphone or tablet computer), an embedded system, or a device in the Internet of Things. In general, SoCs are different from systems having a motherboard-based architecture that separates components based on function and connects them through a central interfacing circuit board.

Embodiments of memory chips described herein that are connected directly to an accelerator chip (e.g., an AI accelerator chip), e.g., see first memory chip 104 shown in FIGS. 1-3 or first memory chip 402 show in FIGS. 4-7, are also referred to herein as application-specific memory chips for the sake of clarity when describing multiple memory chips of the overall system. The application-specific memory chips described herein are not necessarily hardwired specifically for application-specific computations (such as AI computations). Each of the application-specific memory chips can be a DRAM chip or a NVRAM chip, or a memory device with similar functionality to either a DRAM chip or a NVRAM chip. And, each of the application-specific memory chips can be connected directly to an accelerator chip (e.g., an AI accelerator chip), e.g., see accelerator chip 102 shown in FIGS. 1-3 and accelerator chip 404 shown in FIGS. 4-7, and can have memory units or cells specifically for the acceleration of application-specific computations (such as AI computations) by the accelerator chip after the application-specific memory chip is configured by the accelerator chip or a separate SoC or processor (e.g., see SoCs 106 and 406 shown in FIGS. 1-3 and 4-7 respectively).

DRAM chips described herein can include random access memory that stores each bit of data in a memory cell or unit having a capacitor and a transistor (such as a MOSFET). DRAM chips described herein can take the form of an IC chip and include billions of DRAM memory units or cells. In each unit or cell, the capacitor can either be charged or discharged. This can provide two states used to represent two values of a bit. The electric charge on the capacitor can slowly leak from the capacitor, so an external memory refresh circuit which periodically rewrites the data in the capacitor is needed to maintain state of the capacitor and the memory unit. DRAM is also volatile memory and not non-volatile memory, such as flash memory or NVRAM, in that it loses its data quickly when power is removed. A benefit of a DRAM chip is that it can be used in digital electronics requiring low-cost and high-capacity computer memory. DRAM is also beneficial to use as main memory or memory for a GPU specifically.

NVRAM chips described herein can include random-access memory that is non-volatile, which is a main differentiating feature from DRAM. An example of NVRAM units or cells that can be used in embodiments described herein can include 3D XPoint units or cells. In a 3D XPoint unit or cell, bit storage is based on a change of bulk resistance, in conjunction with a stackable cross-gridded data access array.

Embodiments of SoCs described herein can include a main processor (such as a CPU or a main processor including a CPU). For example, see SoC 106 depicted in FIGS. 1-3 and SoC 406 depicted in FIGS. 4-7 as well as main processor 110 shown in FIGS. 1-7. In such embodiments, a GPU in the SoC (e.g., see GPU 108 shown FIGS. 1-3 and GPU 408 shown in FIGS. 4-7) can run instructions for application-specific tasks and computations (such as AI tasks and computations) and the main processor can run instructions for non-application-specific tasks and computations (such as non-AI tasks and computations). And, in such embodiments, the accelerator chip connected to the SoC (e.g. see any one of the accelerator chips shown in FIGS. 1-7) can provide acceleration of application-specific tasks and computations (such as AI tasks and computations) for the GPU specifically. Each one of the embodiments of SoCs described herein can include its own bus for connecting components of the SoC to each other (such as connecting the main processor and the GPU). Also, a bus of a SoC can be configured to connect the SoC to a bus external to the SoC so that the components of the SoC can couple with chips and devices external to the SoC such as a separate memory or memory chip (e.g., see memory 204 depicted in FIGS. 2-3 and 5-7 as well as main memory 808 depicted in FIGS. 8-9).

The non-application-specific computations and tasks (e.g., non-AI computations and tasks) of the GPU or application-specific computations and tasks (e.g., AI computations and tasks) not using the accelerator chip, which may not be conventional tasks performed by the main processor, can use separate memory such as a separate memory chip (which can be application-specific memory) and the memory can be implemented by DRAM, NVRAM, flash memory, or any combination thereof. For example, see memory 204 depicted in FIGS. 2-3 and 5-7 as well as main memory 808 depicted in FIGS. 8-9. A separate memory or memory chip can be connected to the SoC and the main processor (e.g., CPU) via a bus external to the SoC (e.g., see memory 204 depicted in FIGS. 2-3 and 5-7 as well as main memory 808 depicted in FIGS. 8-9; and see bus 202 depicted in FIGS. 2-3 and 5-7 as well as buses 804 depicted in FIGS. 8-9). In such embodiments, the separate memory or memory chip can have memory units specifically for the main processor. Also, the separate memory or memory chip can be connected to the SoC and the GPU via the bus external to the SoC. In such embodiments, the separate memory or memory chip can have memory units or cells for the main processor or the GPU.

It is to be understood for the purposes of this disclosure that an application-specific memory or memory chip described herein (e.g., see first memory chip 104 shown in FIGS. 1-3 or first memory chip 402 shown in FIGS. 4-7) and a separate memory or memory chip described herein (e.g., see memory 204 depicted in FIGS. 2-3 and 5-7 as well as main memory 808 depicted in FIGS. 8-9) can each be substituted with a group of memory chips such as a string of memory chips (e.g., see the strings of memory chips shown in FIGS. 10 and 11). For example, the separate memory or memory chip can be substituted by a string of memory chips that includes at least a NVRAM chip and a flash memory chip downstream of the NVRAM chip. Also, the separate memory chip can be substituted by at least two memory chips where one of the chips is for the main processor (e.g., CPU) and the other chip is for the GPU for use as memory for non-AI computations and/or tasks.

Embodiments of memory chips described herein can be part of main memory and/or can be computer hardware that stores information for immediate use in a computer or for immediate use by any one of the processors described herein (e.g., any SoC or accelerator chip described herein). The memory chips described herein can operate at a higher speed than computer storage. Computer storage provides slower speeds for accessing information, but also can provide higher capacities and better data reliability. The memory chips described herein can include RAM, which is a type of memory, that can have high operation speeds. The memory can be made up of addressable semiconductor memory units or cells, and its units or cells can be at least partially implemented by MOSFETs.

Additionally, at least some embodiments disclosed herein relate to an accelerator chip (e.g., an AI accelerator chip) having a vector processor (e.g., see vector processors 112 and 412 shown in FIGS. 1-3 and 4-7 respectively). And, at least some embodiments disclosed herein relate to using memory hierarchy and a string of memory chips to form a memory (e.g., see FIGS. 10 and 11).

Embodiments of vector processors described herein are each an IC that can implement an instruction set containing instructions that operate on one-dimensional arrays of data called vectors or multidimensional arrays of data called matrices. Vector processor are different from scalar processors, whose instructions operate on single data items. In some embodiments, a vector processor can go beyond merely pipelining instructions and pipeline the data itself. Pipelining can include a process where instructions, or in the case of a vector processor, data itself, passes through multiple sub-units in turn. In some embodiments, the vector processor is fed instructions that instruct an arithmetic operation on a vector or matrix of numbers simultaneously. Instead of continually having to decode instructions and then fetch the data needed to complete the instructions, the vector processor reads a single instruction from memory, and it is simply implied in the definition of the instruction itself that the instruction will operate again on another item of data, at an address one increment larger than the last. This allows for significant savings in decoding time.

Figure 8:
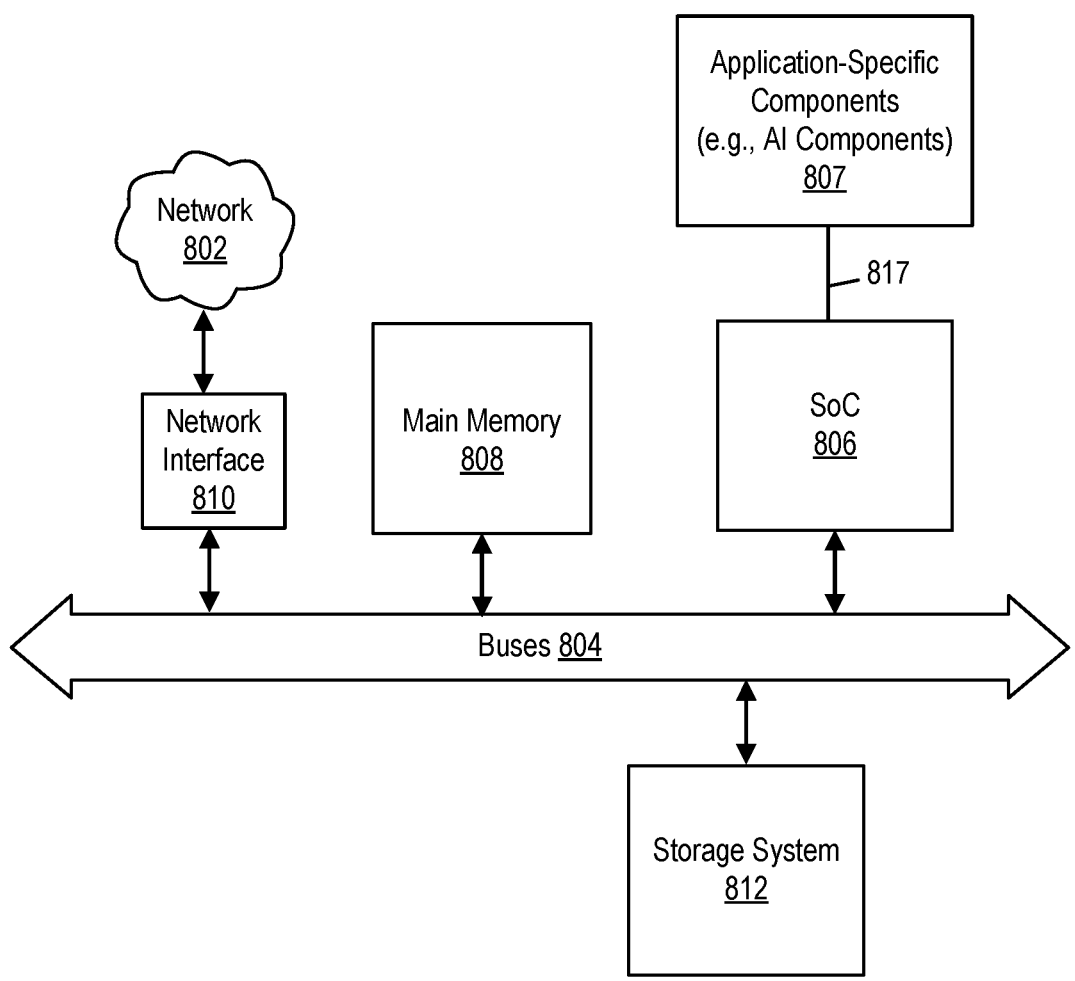
FIG. 8 illustrates an example arrangement of parts of an example computing device, in accordance with some embodiments of the present disclosure.

FIG. 8 illustrates an example arrangement of parts of an example computing device 800, in accordance with some embodiments of the present disclosure. The example arrangement of parts of the computing device 800 can include system 100 shown in FIG. 1, system 200 shown in FIG. 2, system 400 shown in FIG. 4, system 500 shown in FIG. 5, and system 600 shown in FIG. 6. In the computing device 800, application-specific components (e.g., see application-specific components 807 in FIG. 8), which can be AI components, can include the first memory chip 104 or 402 and the accelerator chip 102 or 404 as arranged and shown in FIGS. 1, 2, 4, 5, and 6 respectively as well as the SoC 106 or 406 as configured and shown in FIGS. 1, 2, 4, 5, and 6 respectively. In the computing device 800, wiring directly connects components of the application-specific components to each other (e.g., see wiring 124 and 424 as well as wiring 614 shown in FIGS. 1-2 and 4-6 respectively). And, in computing device 800, wiring directly connects the application-specific components to the SoC (e.g., see wiring 817 that directly connects the application-specific components to SoC 806). The wiring that directly connects the application-specific components to the SoC can include wiring 126 as shown in FIGS. 1 and 2 or wiring 426 as shown in FIGS. 4 and 5. Also, the wiring that directly connects the application-specific components to the SoC can include wiring 616 as shown in FIG. 6.

The computing device 800 can be communicatively coupled to other computing devices via the computer network 802 as shown in FIG. 8. The computing device 800 includes at least buses 804 (which can be one or more buses—such as a combination of a memory bus and a peripheral bus), a SoC 806 (which can be or include SoC 106 or 406), application-specific components 807 (which can be accelerator chip 102 and first memory chip 104 or first memory chip 402 and accelerator chip 404) and a main memory 808 (which can be or include memory 204), as well as a network interface 810, and a data storage system 812. The buses 804 communicatively couples the SoC 806, the main memory 808, the network interface 810, and the data storage system 812. And, the buses 804 can include bus 202 and/or a point-to-point memory connection such as wiring 126, 426, or 616. The computing device 800 includes a computer system that includes at least one or more processors in the SoC 806, main memory 808 (e.g., read-only memory (ROM), flash memory, DRAM such as synchronous DRAM (SDRAM) or Rambus DRAM (RDRAM), NVRAM, SRAM, etc.), and data storage system 812, which communicate with each other via buses 804 (which can include one or more buses and wirings).

The main memory 808 (which can be, include, or be included in the memory 204) can include the memory string 1000 depicted in FIG. 10. Also, the main memory 808 can include the memory string 1100 depicted in FIG. 11. In some embodiments, the data storage system 812 can include the memory string 1000 or the memory string 1100.

SoC 806 can include one or more general-purpose processing devices such as a microprocessor, a CPU, or the like. Also, the SoC 806 can include one or more special-purpose processing devices such as a GPU, an ASIC, FPGA, a digital signal processor (DSP), network processor, a processor in memory (PIM), or the like. The SoC 806 can include one or more processors with a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processors of the SoC 806 can be configured to execute instructions for performing the operations and steps discussed herein. SoC 806 can further include a network interface device such as network interface 810 to communicate over one or more communications network such as network 802.

The data storage system 812 can include a machine-readable storage medium (also known as a computer-readable medium) on which is stored one or more sets of instructions or software embodying any one or more of the methodologies or functions described herein. The instructions can also reside, completely or at least partially, within the main memory 808 and/or within one or more of the processors of the SoC 806 during execution thereof by the computer system, the main memory 808 and the one or more processors of the SoC 806 also constituting machine-readable storage media.

While the memory, processor, and data storage parts are shown in the example embodiment to each be a single part, each part should be taken to include a single part or multiple parts that can store the instructions and perform their respective operations. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Figure 9:
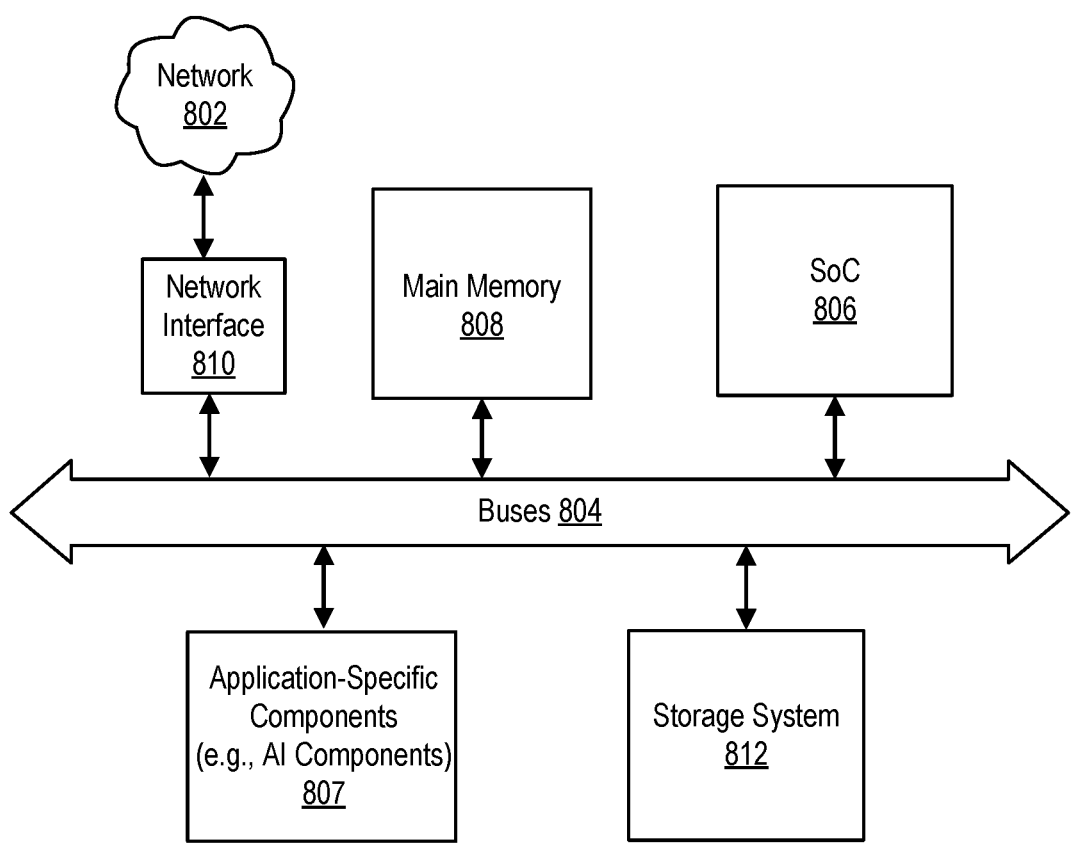
FIG. 9 illustrates another example arrangement of parts of an example computing device, in accordance with some embodiments of the present disclosure.

FIG. 9 illustrates another example arrangement of parts of an example computing device 900, in accordance with some embodiments of the present disclosure. The example arrangement of parts of the computing device 900 can include system 300 shown in FIG. 3 as well as system 700 shown in FIG. 7. In the computing device 900, application-specific components (e.g., see application-specific components 807 in FIG. 9), which can be AI components, can include the first memory chip 104 or 402 and the accelerator chip 102 or 404 as arranged and shown in FIGS. 3 and 7 respectively as well as the SoC 106 or 406 as configured and shown in FIGS. 3 and 7 respectively. In the computing device 900, wiring directly connects components of the application-specific components to each other (e.g., see wiring 124 and 424 shown in FIGS. 3 and 7 respectively). However, in computing device 900, wiring does not directly connect the application-specific components to the SoC. Instead, in computing device 900, one or more busses connects the application-specific components to the SoC (e.g., see buses 804 as configured and shown in FIG. 9 as well as bus 202 as configured and shown in FIGS. 3 and 7).

As shown by FIGS. 8 and 9, devices 800 and 900 have many similar components. The computing device 900 can be communicatively coupled to other computing devices via the computer network 802 as shown in FIG. 9. Similarly, as shown in FIG. 9, computing device 900 includes at least buses 804 (which can be one or more buses—such as a combination of a memory bus and a peripheral bus), SoC 806 (which can be or include SoC 106 or 406), application-specific components 807 (which can be accelerator chip 102 and first memory chip 104 or first memory chip 402 and accelerator chip 404) and main memory 808 (which can be or include memory 204), as well as network interface 810, and data storage system 812. Similarly, the buses 804 communicatively couples the SoC 806, the main memory 808, the network interface 810, and the data storage system 812. And, the buses 804 can include bus 202 and/or a point-to-point memory connection such as wiring 126, 426, or 616.

As mentioned, at least some embodiments disclosed herein relate to using memory hierarchy and a string of memory chips to form a memory.

FIGS. 10 and 11 illustrate example strings of memory chips 1000 and 1100 respectively, which can be used in the separate memory depicted in FIGS. 2-3 and 5-7 (i.e., memory 204).

In FIG. 10, the memory chip string 1000 includes a first memory chip 1002 and a second memory chip 1004. The first memory chip 1002 is directly wired to the second memory chip 1004 (e.g., see wiring 1022) and is configured to interact directly with the second memory chip. Each chip in the memory chip string 1000 can include one or more sets of pins for connecting to an upstream chip and/or downstream chip in the string (e.g., see sets of pins 1012 and 1014). In some embodiments, each chip in the memory chip string 1000 can include a single IC enclosed within a IC package.

As shown in FIG. 10, set of pins 1012 is part of first memory chip 1002 and connects first memory chip 1002 to second memory chip 1004 via wiring 1022 and set of pins 1014 that is part of second memory chip 1004. The wiring 1022 connects the two sets of pins 1012 and 1014.

In some embodiments, the second memory chip 1004 can have a lowest memory bandwidth of the chips in the string 1000. In such embodiments and others, the first memory chip 1002 can have a highest memory bandwidth of the chips in the string 1000. In some embodiments, the first memory chip 1002 is or includes a DRAM chip. In some embodiments, the first memory chip 1002 is or includes a NVRAM chip. In some embodiments, the second memory chip 1004 is or includes a DRAM chip. In some embodiments, the second memory chip 1004 is or includes a NVRAM chip. And, in some embodiments, the second memory chip 1004 is or includes a flash memory chip.

In FIG. 11, the memory chip string 1100 includes a first memory chip 1102, a second memory chip 1104, and a third memory chip 1106. The first memory chip 1102 is directly wired to the second memory chip 1104 (e.g., see wiring 1122) and is configured to interact directly with the second memory chip. The second memory chip 1104 is directly wired to the third memory chip 1106 (e.g., see wiring 1124) and is configured to interact directly with the third memory chip. In such ways, the first and third memory chips 1102 and 1106 interact with each other indirectly via the second memory chip 1104.

Each chip in the memory chip string 1100 can include one or more sets of pins for connecting to an upstream chip and/or downstream chip in the string (e.g., see sets of pins 1112, 1114, 1116, and 1118). In some embodiments, each chip in the memory chip string 1100 can include a single IC enclosed within a IC package.

As shown in FIG. 11, set of pins 1112 is part of first memory chip 1102 and connects first memory chip 1102 to second memory chip 1104 via wiring 1122 and set of pins 1114 that is part of second memory chip 1104. The wiring 1122 connects the two sets of pins 1112 and 1114. Also, set of pins 1116 is part of second memory chip 1104 and connects second memory chip 1104 to third memory chip 1106 via wiring 1124 and set of pins 1118 that is part of third memory chip 1106. The wiring 1124 connects the two sets of pins 1116 and 1118.

In some embodiments, the third memory chip 1106 can have a lowest memory bandwidth of the chips in the string 1100. In such embodiments and others, the first memory chip 1102 can have a highest memory bandwidth of the chips in the string 1100. Also, in such embodiments and others, the second memory chip 1104 can have the next highest memory bandwidth of the chips in the string 1100. In some embodiments, the first memory chip 1102 is or includes a DRAM chip. In some embodiments, the first memory chip 1102 is or includes a NVRAM chip. In some embodiments, the second memory chip 1104 is or includes a DRAM chip. In some embodiments, the second memory chip 1104 is or includes a NVRAM chip. In some embodiments, the second memory chip 1104 is or includes a flash memory chip. In some embodiments, the third memory chip 1106 is or includes a NVRAM chip. And, in some embodiments, the third memory chip 1106 is or includes a flash memory chip.

In embodiments having one or more DRAM chips, a DRAM chip can include a logic circuit for command and address decoding as well as arrays of memory units of DRAM. Also, a DRAM chip described herein can include a cache or buffer memory for incoming and/or outgoing data. In some embodiments, the memory units that implement the cache or buffer memory can be different from the DRAM units on the chip hosting the cache or buffer memory. For example, the memory units that implement the cache or buffer memory on the DRAM chip can be memory units of SRAM.

In embodiments having one or more NVRAM chips, a NVRAM chip can include a logic circuit for command and address decoding as well as arrays of memory units of NVRAM such as units of 3D XPoint memory. Also, a NVRAM chip described herein can include a cache or buffer memory for incoming and/or outgoing data. In some embodiments, the memory units that implement the cache or buffer memory can be different from the NVRAM units on the chip hosting the cache or buffer memory. For example, the memory units that implement the cache or buffer memory on the NVRAM chip can be memory units of SRAM.

In some embodiments, NVRAM chips can include a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

As mentioned herein, NVRAM chips can be or include cross point storage and memory devices (e.g., 3D XPoint memory). A cross point memory device uses transistor-less memory elements, each of which has a memory cell and a selector that are stacked together as a column. Memory element columns are connected via two perpendicular lays of wires, where one lay is above the memory element columns and the other lay below the memory element columns. Each memory element can be individually selected at a cross point of one wire on each of the two layers. Cross point memory devices are fast and non-volatile and can be used as a unified memory pool for processing and storage.

In embodiments having one or more flash memory chips, a flash memory chip can include a logic circuit for command and address decoding as well as arrays of memory units of flash memory such as units of NAND-type flash memory. Also, a flash memory chip described herein can include a cache or buffer memory for incoming and/or outgoing data. In some embodiments, the memory units that implement the cache or buffer memory can be different from the flash memory units on the chip hosting the cache or buffer memory. For example, the memory units that implement the cache or buffer memory on the flash memory chip can be memory units of SRAM.

Also, for example, an embodiment of the string of memory chips can include DRAM to DRAM to NVRAM, or DRAM to NVRAM to NVRAM, or DRAM to flash memory to flash memory; however, DRAM to NVRAM to flash memory may provide a more effective solution for a string of memory chips being flexibly provisioned as multi-tier memory.

Also, for the purposes of this disclosure, it is to be understood that that DRAM, NVRAM, 3D XPoint memory, and flash memory are techniques for individual memory units, and that a memory chip for any one of the memory chips described herein can include a logic circuit for command and address decoding as well as arrays of memory units of DRAM, NVRAM, 3D XPoint memory, or flash memory. For example, a DRAM chip described herein includes a logic circuit for command and address decoding as well as an array of memory units of DRAM. For example, a NVRAM chip described herein includes a logic circuit for command and address decoding as well as an array of memory units of NVRAM. For example, a flash memory chip described herein includes a logic circuit for command and address decoding as well as an array of memory units of flash memory.

Also, a memory chip for any one of the memory chips described herein can include a cache or buffer memory for incoming and/or outgoing data. In some embodiments, the memory units that implement the cache or buffer memory may be different from the units on the chip hosting the cache or buffer memory. For example, the memory units that implement the cache or buffer memory can be memory units of SRAM.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system, comprising:
an artificial intelligence (AI) accelerator chip; and
a memory chip, comprising:
- a first set of pins configured to connect to a system on a chip (SoC);
- a first plurality of memory cells configured to receive and store computation input data received from the SoC, via the first set of pins;
- a second set of pins configured to provide the computation input data to the AI accelerator chip as AI computation input; and
- a second plurality of memory cells configured to store AI computation output data received from the AI accelerator chip via the second set of pins, and to either be retrieved by the SoC or reused by the AI accelerator chip as AI computation input.

2. The system of claim 1, wherein the memory chip comprises a third plurality of memory cells configured to store second computation output data received from the SoC, via the first set of pins, to be retrieved by the SoC.

3. The system of claim 2, wherein the first, second, and third pluralities of memory cells comprise dynamic random-access memory (DRAM) cells.

4. The system of claim 2, wherein the first, second, and third pluralities of memory cells comprise non-volatile random-access memory (NVRAM) cells.

5. The system of claim 4, wherein the NVRAM cells comprise 3D XPoint memory cells.

6. The system of claim 1, wherein the accelerator chip comprises a vector processor that is configured to perform numerical calculations on vectors and matrices for the SoC using the first and second pluralities of memory cells as memory.

7. The system of claim 6, wherein the accelerator chip comprises an application-specific integrated circuit (ASIC) that comprises the vector processor and is configured to accelerate AI computations through the vector processor.

8. The system of claim 6, wherein the accelerator chip comprises field-programmable gate arrays (FPGA) that comprise the vector processor and are configured to accelerate AI computations through the vector processor.

9. A system, comprising:
an artificial intelligence (AI) accelerator chip;
a system on a chip (SoC); and
a memory chip, comprising:
- a first set of pins configured to connect to the SoC;
- a second set of pins configured to connect to the AI accelerator chip;
- a first plurality of memory cells configured to receive and store computation input data received from the SoC, via the first set of pins, to be used by the AI accelerator chip as computation input via the second set of pins; and
- a second plurality of memory cells configured to store AI computation output data received from the AI accelerator chip via the second set of pins, and to either be retrieved by the SoC or reused by the AI accelerator chip as AI computation input.

10. The system of claim 9, wherein the SoC comprises a graphics processing unit (GPU), and wherein the accelerator chip is configured to perform and accelerate computations for the GPU using the first and second pluralities of memory cells as memory.

11. The system of claim 10, wherein the accelerator chip comprises a vector processor that is configured to perform numerical calculations on vectors and matrices for the GPU using the first and second pluralities of memory cells as memory.

12. A memory chip, comprising:
- a first set of pins configured to connect to a system on a chip (SoC);
- a second set of pins configured to connect to an artificial intelligence (AI) accelerator chip;
- a first plurality of memory cells configured to receive and store AI computation input data received from the SoC, via the first set of pins; and to be used by the artificial intelligence (AI) accelerator chip as AI computation input, via the second set of pins; and
- a second plurality of memory cells configured to store AI computation output data received from the AI accelerator chip via the second set of pins, and to either be retrieved by the SoC or reused by the AI accelerator chip as AI computation input.

13. The memory chip of claim 12, comprising a third plurality of memory cells configured to store non-AI data related to non-AI tasks received from the SoC, via the first set of pins, to be retrieved by the SoC for non-AI tasks.

14. The memory chip of claim 13, wherein the first, second, and third pluralities of memory cells comprise dynamic random-access memory (DRAM) cells.

15. The memory chip of claim 13, wherein the first, second, and third pluralities of memory cells comprise non-volatile random-access memory (NVRAM) cells.

16. The memory chip of claim 15, wherein the NVRAM cells comprise 3D XPoint memory cells.

* * * * *